United States Patent
Cook et al.

(10) Patent No.: US 9,496,171 B2
(45) Date of Patent: Nov. 15, 2016

(54) PRINTED INTERCONNECTS FOR SEMICONDUCTOR PACKAGES

(71) Applicant: Texas Instruments Incorporated, Dallas, TX (US)

(72) Inventors: Benjamin Stassen Cook, Dallas, TX (US);
(Continued)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/848,941

(22) Filed: Sep. 9, 2015

(65) Prior Publication Data
US 2016/0093525 A1 Mar. 31, 2016

Related U.S. Application Data

(60) Provisional application No. 62/055,971, filed on Sep. 26, 2014.

(51) Int. Cl.
*H01L 23/48* (2006.01)
*H01L 21/768* (2006.01)
(Continued)

(52) U.S. Cl.
CPC ....... *H01L 21/76838* (2013.01); *H01L 23/528* (2013.01); *H01L 24/24* (2013.01);
(Continued)

(58) Field of Classification Search
CPC .................. H01L 23/528; H01L 24/24; H01L 24/82
(Continued)

(56) References Cited

U.S. PATENT DOCUMENTS

| 6,372,552 B1 * | 4/2002 | Kinsman | H01L 23/3107 257/E23.124 |
| 6,506,438 B2 * | 1/2003 | Duthaler | B41J 3/4076 427/146 |

(Continued)

OTHER PUBLICATIONS

Notification of Transmittal of the International Search Report and the Written Opinion of the International Searching Authority, or the Declaration mail date: Dec. 29, 2015.

*Primary Examiner* — Nitin Parekh
(74) *Attorney, Agent, or Firm* — Rose Alyssa Keagy; Frank D. Cimino (57) ABSTRACT

A method forming a packaged semiconductor device includes providing a first semiconductor die (first die) having bond pads thereon mounted face-up on a package substrate or on a die pad of a lead frame (substrate), wherein the substrate includes terminals or contact pads (substrate pads). A first dielectric layer is formed including printing a first dielectric precursor layer including a first ink having a first liquid carrier solvent extending from the substrate pads to the bond pads. A first interconnect precursor layer is printed including a second ink having a second liquid carrier over the first dielectric layer extending from the substrate pads to the bond pads. Sintering or curing the first interconnect precursor layer removes at least the second liquid carrier to form an electrically conductive interconnect including an ink residue which connects respective substrate pads to respective bond pads.

18 Claims, 5 Drawing Sheets

(72) Inventors: Juan Alejandro Herbsommer, Allen, TX (US); Matthew David Romig, Wylie, TX (US); Steven Alfred Kummerl, Carrolton, TX (US); Wei-Yan Shih, Plano, TX (US)

(51) Int. Cl.
*H01L 23/528* (2006.01)
*H01L 23/00* (2006.01)

(52) U.S. Cl.
CPC ..... *H01L 24/82* (2013.01); *H01L 2224/24998* (2013.01); *H01L 2224/32245* (2013.01); *H01L 2224/48091* (2013.01); *H01L 2224/48247* (2013.01); *H01L 2224/73265* (2013.01); *H01L 2924/13055* (2013.01); *H01L 2924/181* (2013.01)

(58) Field of Classification Search
USPC .................................. 257/676, 784, 783, 666
See application file for complete search history.

(56) References Cited

U.S. PATENT DOCUMENTS

| | | | | |
|---|---|---|---|---|
| 6,750,473 | B2* | 6/2004 | Amundson | H01L 51/0021 257/20 |
| 7,286,053 | B1* | 10/2007 | Gudeman | G08B 13/2414 340/572.1 |
| 7,382,363 | B2* | 6/2008 | Albert | G02F 1/167 345/107 |
| 7,745,942 | B2* | 6/2010 | Hembree | G01R 1/07314 257/734 |
| 7,824,963 | B2 | 11/2010 | Walberg et al. | |
| 2006/0133608 | A1* | 6/2006 | Kim | H04L 9/0662 380/44 |
| 2007/0296090 | A1* | 12/2007 | Hembree | G01R 1/07314 257/784 |
| 2009/0137071 | A1* | 5/2009 | Subramanian | G08B 13/242 438/22 |
| 2009/0191665 | A1* | 7/2009 | Nikitin | H01L 21/568 438/107 |
| 2010/0123248 | A1* | 5/2010 | Yajima | C25D 5/10 257/741 |
| 2012/0044659 | A1 | 2/2012 | Rathburn | |
| 2012/0061851 | A1 | 3/2012 | Rathburn | |
| 2013/0154110 | A1 | 6/2013 | Gowda | |
| 2014/0080258 | A1 | 3/2014 | Rathburn | |
| 2014/0175599 | A1 | 6/2014 | Romig et al. | |
| 2015/0262931 | A1* | 9/2015 | Vincent | H01L 21/76838 257/773 |
| 2016/0099210 | A1* | 4/2016 | Kwon | H01L 21/76877 257/774 |

\* cited by examiner

PRINTED INTERCONNECTS FOR SEMICONDUCTOR PACKAGES

CROSS REFERENCE TO RELATED APPLICATIONS

This application claims the benefit of Provisional Application Ser. No. 62/055,971 entitled "PRINTING PACKAGING INTERCONNECTS FOR HIGH FREQUENCY SIGNALING AND SHIELDING" filed Sep. 26, 2014, which is herein incorporated by reference in its entirety.

FIELD

Disclosed embodiments relate to additive printing for semiconductor packages.

BACKGROUND

In conventional semiconductor packaging, signals are routed from bond pads on the die (or chip) to the package pins (or terminals) using wirebonds or flip chip interconnects. In a flip chip arrangement also called Direct Chip Attach (DCA), a die having solder bumps on its bond pads is flipped (face-down) onto a package comprising a substrate, circuit board, or carrier, where the bond pads of the die are bonded to contact pads or terminals the package through re-flowing of the solder bumps. Wirebond interconnects use bond wires to connect the bond pads on the die to the contact pads or terminals of the package. Wire bonding is more commonly used due to lower cost and better robustness.

SUMMARY

This Summary is provided to introduce a brief selection of disclosed concepts in a simplified form that are further described below in the Detailed Description including the drawings provided. This Summary is not intended to limit the claimed subject matter's scope.

One disclosed embodiment is an interconnect embodiment that recognizes wirebonds (bond wires) generally perform poorly at high frequency (e.g., >20 GHz), as they are no longer significantly longer in electrical length as compared to the signal wavelength so that transmission line effects can develop. As a result, bond wires can undesirably act as transmission lines. Moreover, it is difficult to control the impedance of bond wire transmission lines for several reasons. The length of the bond wire can differ from bond wire to bond wire for a given device, the distance between bond wires can change when the mold compound for plastic packages is applied to the package (the wire sweep), and the impedance of a bond wire transmission line is typically high and not able to be tuned due to the required bond wire to bond wire spacing and thickness of the bond wires.

Disclosed embodiments include methods of forming packaged semiconductor devices including additively printed interconnects that replace conventional bond wires. A first semiconductor die (first die) is provided having bond pads thereon mounted face up on a package substrate or on a die pad of a lead frame (substrate), where the substrate has contact pads or terminals (substrate pads). A first dielectric layer is formed comprising printing a first dielectric precursor layer comprising a first ink including a first liquid carrier extending from respective substrate pads to respective bond pads. A first patterned interconnect precursor layer (first interconnect precursor layer) comprising a second ink including a second liquid carrier is printed over the first dielectric layer or first dielectric precursor layer extending from the substrate pads to the bond pads. The first interconnect precursor layer is sintered or cured to remove at least the second liquid carrier to form electrically conductive interconnect(s).

As used herein an "ink" includes a material that is either solid (e.g., particles, such as nanoparticles) or a precursor for a solid that forms a solid (e.g., particles) upon curing or sintering a liquid carrier that includes a solvent and/or a dispersant. For example in the case of a precursor for a solid, the ink can be, for example, a sinterable metal ink or a UV-curable polymer or a UV-curable polymer-based mixture. The ink is additively depositable by an ink printing apparatus. The ink printing apparatus can comprise an inkjet printer that uses piezoelectric, thermal, or acoustic or electrostatics, an aerosol jet, stencil, micro-deposition printer, or a screen or flexographic printer.

Another disclosed embodiment is an electromagnetic interference (EMI) shield embodiment that recognizes as the frequency and/or voltage increases with integrated circuits (ICs), EMI is becoming an increasing problem. EMI is the disruption of operation of an electronic device when it in the vicinity of an electromagnetic field (EM field). Two dimensional (2D) isolation techniques such as guard rings within the metal stack of the IC are recognized to no longer generally be effective for properly shielding of EMI. Trenches within the IC die can also be used, but trenches do not solve the problem of external source EMI on the IC die. This embodiment comprises additive printing-based package and chip-based EMI shielding solutions for isolating from EMI high susceptibility areas on the IC die and within the package.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

A first example ink-based additive printing method is for forming interconnects for semiconductor packages to replace bondwires. Disclosed printing of the interconnects allows for 2D (controlled x-y pattern) and 3D spatial and geometrical control (controlled vertical height) of the interconnects to enable creating any arbitrary 2D/3D shape interconnect, as well as multi-conductor transmission lines, which allow the interconnects to work up to much higher frequencies as compared to conventional bond wires, such as up to 100's of GHz. Disclosed interconnects overcome the high frequency limitations of conventional wirebond technology by using an ink-based deposition technique, such as using an inkjet, aerosol jet, or screen printing to deposit ink-based patterned interconnects which extend from the bond pads on a die, or multiple stacked die, to contact pads or terminals of a lead frame or a package substrate. Several ink-based methods can be used to realize disclosed printed interconnects as described herein.

Figure 1A:
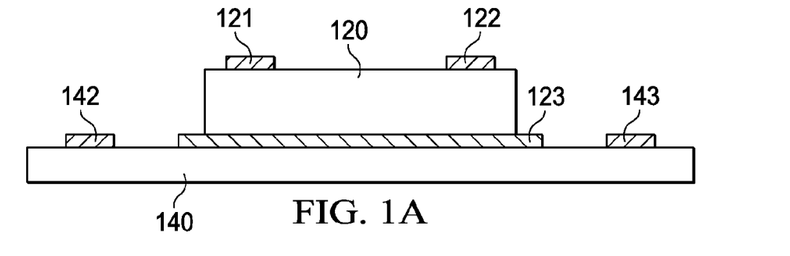
FIGS. 1A-C depict steps in an example ink-based method for forming an additively printed interconnect in the shape of bond wires, according to an example embodiment.
Figure 1B:
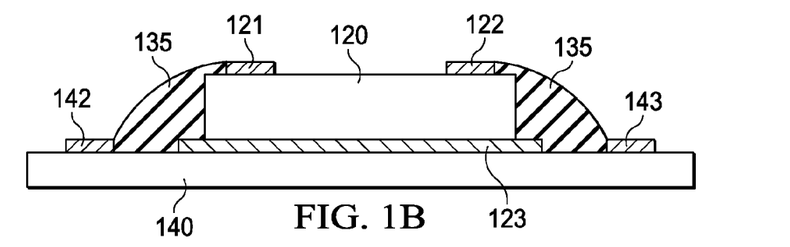
Figure 1C:
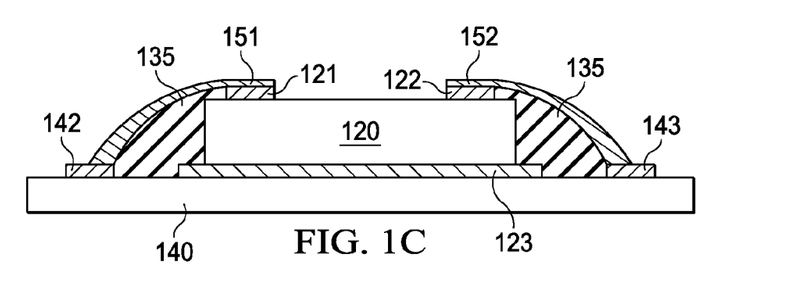

FIGS. 1A-C depict cross section depictions corresponding to steps in an example ink-based deposition method for forming interconnects analogous to wirebonds, according to an example embodiment. FIG. 1A shows the resulting structure after a first semiconductor die (die) 120 having bond pads 121, 122 thereon is mounted face up on a substrate 140 shown as a package substrate, wherein the substrate 140 includes terminals or contact pads (substrate pads) 142, 143. The die 120 is mounted to the substrate 140 by a die attach material 123. The substrate 140 can comprise essentially any structure one can mount a semiconductor die on, including a leadframe, or a package substrate such as a ceramic substrate, a ball grid array (BGA), a pin grid array (PGA), a printed circuit board (PCB), an organic substrate, a flexible plastic substrate, or a paper-based substrate.

FIG. 1B shows the resulting structure after forming a first dielectric layer 135 comprising printing a first dielectric precursor layer comprising a first ink including first liquid carrier extending from respective ones of the substrate pads 142, 143 to respective ones of the bond pads 121, 122. The first dielectric layer 135 is printed in a ramp shape with a controllable slope from the substrate 140 to the die 120 increasing in thickness towards the die 120. It is noted that due to manufacturing tolerances the first dielectric layer 135 can overlap the bond pads 121, 122 and/or the substrate pads 142, 143 partially while still serving as the function of a underlying layer for the interconnects 151, 152 described below. Conversely, a small gap between first dielectric layer 135 and the bond pads 121, 122 and/or the substrate pads 142, 143 may also be acceptable as long as the gap from one pad does not extend to another.

FIG. 1C shows the resulting structure after printing a first patterned interconnect precursor layer (first interconnect precursor layer) comprising a second ink including at least a second liquid carrier over the first dielectric layer 135 extending from respective ones of the substrate pads 142, 143 to respective ones of the bond pads 121, 122 and sintering or curing the first interconnect precursor layer to remove at least the second liquid carrier to form electrically conductive interconnects (interconnects) 151, 152 which comprise ink residue. Interconnect 151 connects bond pad 122 to substrate pad 143 and interconnect 152 connects bond pad 121 to substrate pad 142. Interconnect 151 is no longer subject to conventional bond wire movement problem due to the molding process, as it is formed on a solid layer (first dielectric layer 135) instead of standing in free air in the case of bond wires.

The interconnects 151, 152 can be in any arbitrary 2D or 3D geometrical pattern. As used herein, an "electrically conductive" interconnect refers to a sintered or cured ink residue that provides a 25° C. bulk electrical conductivity of ≥100 S/m. Disclosed metal residues formed from sintering typically have a 25° C. bulk electrical conductivity of about 1 to $3 \times 10^7$ S/m, while disclosed polymer residues formed from curing a polymer precursor typically have a 25° C. bulk electrical conductivity of about 100 S/m to $1 \times 10^5$ S/m. Example electrically conductive interconnect materials include conductive (e.g., conjugated) polymers, metals and some doped semiconductors. As used herein, a "thermally conductive" interconnect refers to a sintered or cured ink residue that provides a 25° C. bulk thermal conductivity ≥5 W/m·K. Most metal-based inks upon sintering are both electrically conductive and thermally conductive.

Metallic nanoinks used for a disclosed inkjet printing process for printing interconnects can be selected from any of a number of commercially available or customized nanoinks. One example of a commercial provider of such metallic nanoinks is Cima NanoTech of St. Paul, Minn. In various embodiments, such nanoinks can have nanosize copper, silver, palladium, platinum and/or gold particles mixed into a water-based or other liquid-based carrier formulation to be printed onto the surface to create either a rough topology on the surface, or a different metal chemistry at the surface. The overall nanoink composition may range from 20% to 95% metallic particle loading by weight, although other composition percentages can also be used. Metal particles in an example nanoink can range in size from a diameter of about 5 nms to 100 nms, although smaller or larger particle sizes can also be used. Other types of metals may also be used, although the metals listed above generally work well.

The inkjet printer can be selected from any of a number of commercially available or customized inkjet printers. Alternatively, a customized inkjet printer can be designed to work for the specific nanoink. One example of such a customized inkjet printer can be one specifically designed for manufacture by Dimatix, Inc. of Santa Clara, Calif. In further embodiments, a series of inkjet printers can be used, such as where several different distinct nanoinks are to be printed. Such different nanoinks may comprise different metals, may be printed in interactive patterns or layouts, and/or may be printed atop one other, such as after a cure process for each one.

In the case of a metal ink including metal nanoparticles, the sintering can take place at a temperature typically between 60° C. and 200° C. However, the sintering or curing temperature may be limited to 60° C. to 100° C. in the case of plastic or other low heat tolerance packaging material.

The resulting ink residue films or islands have a microstructure which significantly differs and is morphologically distinct from films formed from conventional metal deposition techniques (e.g., low pressure chemical vapor deposition (LPCVD) or sputtering). As used herein, an ink residue has a high relative porosity and associated specific surface area, typically having at least a portion that has a porosity between 10% and 80%, typically being 20% to 60%. The porosity may not be uniform along its thickness, with the highest porosity generally being towards the top of the ink residue.

For printability the ink utilized typically comprises a solvent (10-90 wt. %), conductive material particles (0.5%-90%), dispersant (0.1-5%), and optional surfactant (0-5%) and binder (0-10%). Example inks include PVNanocell conductive silver ink (150-TNG), Intrisiq conductive copper ink, and Cabot CCI-300 conductive silver ink.

To provide a low resistance contacts to the substrate pads or bond pads that the ink is printed over, one of the following is generally provided or performed:

i) The ink has a component which dissolves/etches away the native oxide that is on the substrate pads or bond pads, such as an acid including phosphoric acid, hydrofluoric acid, or acetic acid, a base such as ammonium hydroxide, or an oxidizer such as hydrogen peroxide.

ii) A plasma step on the substrate pads or bond pads is performed right before printing the ink for using a plasma, such as Ar, forming gas ($N_2/H_2$), $H_2$, $CH_4$, $CHF_3$, or $O_2$, or combination thereof. For this, the ink printer can be outfitted with an atmospheric plasma print head which passes in front of the ink material print head at a time before printing.

iii) A high temperature or laser/xenon flash cure performed which can diffuse the ink material through the thin native oxide layer on the contact pads.

Figure 2A:
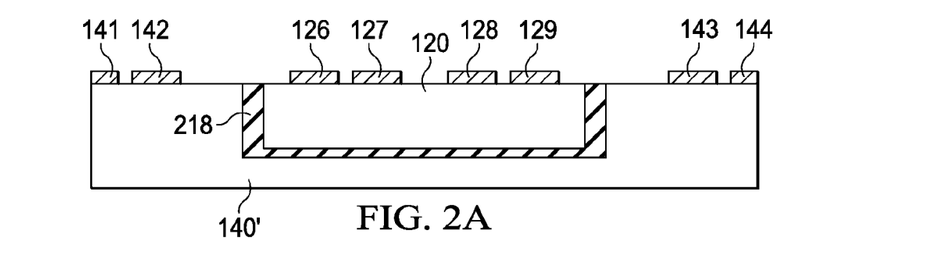
FIGS. 2A-D depict steps in another example ink-based method for forming an additively printed interconnect in the shape of bond wires, according to an example embodiment.

FIGS. 2A-D depict steps in another example ink-based method for forming printed interconnects analogous to wirebonds using a substrate 140' having an inset region, where FIG. 2A shows the resulting structure after a die 120 having bond pads 126, 127, 128, 129 is mounted within the inset region of the substrate 140' having substrate pads 141, 142, 142, 144. The substrate 140' can be a package substrate or a lead frame. The die 120 is mounted over a liner layer 218 that generally comprises a dielectric material.

The liner layer 218 may also comprise a metallic or a non-metal thermally conductive layer. The liner layer 218 may comprise an electrical conductive liner when the semiconductor die will be grounded in its application on its backside. When the backside of the semiconductor die is on a thermal pad, such as in typical quad-flat no-lead (QFN) packages, a thermally conductive liner will minimize the thermal resistance of the package. Alternatively, the liner layer 218 can comprise an ink residue of a dielectric ink. It is also noted that the liner layer 218 does not have to fill the side gap between the semiconductor die and the substrate inset. The subsequently printed dielectric layer 231 can be used to fill the gap and serve a planarization purpose.

Figure 2B:
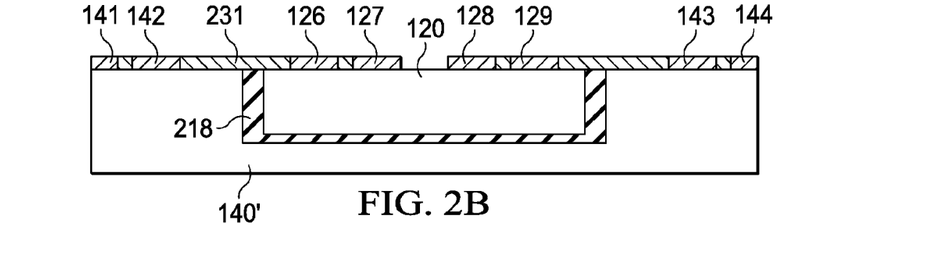
Figure 2C:
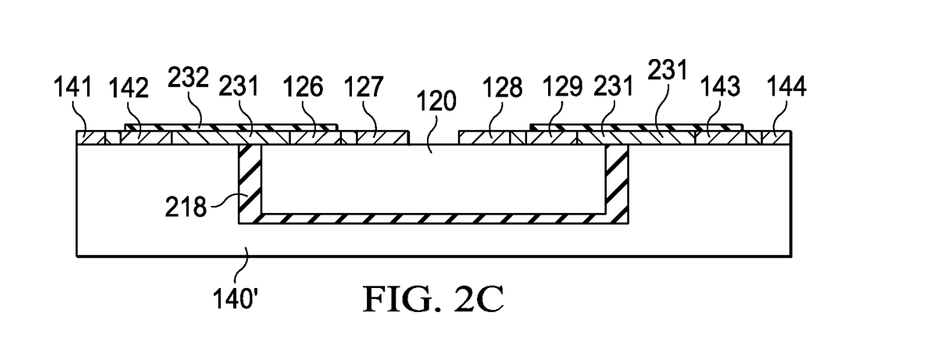

FIG. 2B shows the resulting structure after a dielectric layer 231 comprising an ink residue is printed between the substrate pads 141, 142, 143, 144 and between the bond pads 126-129 on the die 120, which is then cured or sintered. FIG. 2C shows the resulting structure after an electrically conductive (e.g., metal) interconnect layer (interconnect) 232 comprising an ink residue is printed over the structure shown in FIG. 2B and is then sintered or cured. Interconnect 232 is shown connecting bond pad 126 to substrate pad 142, and bond pad 129 to substrate pad 143. The interconnect 232 pattern can be any arbitrary 2D or 3D geometrical pattern, such a slot, coplanar waveguide or microstrip (assuming a ground is above or below) pattern. Optionally, successive dielectric and electrically conductive (e.g., metal) layer(s) can be printed then sintered or cured to stack interconnects on top of each other, forming multi-layer conductor interconnects, such as the stripline waveguide shown in FIG. 4B described below.

Figure 2D:
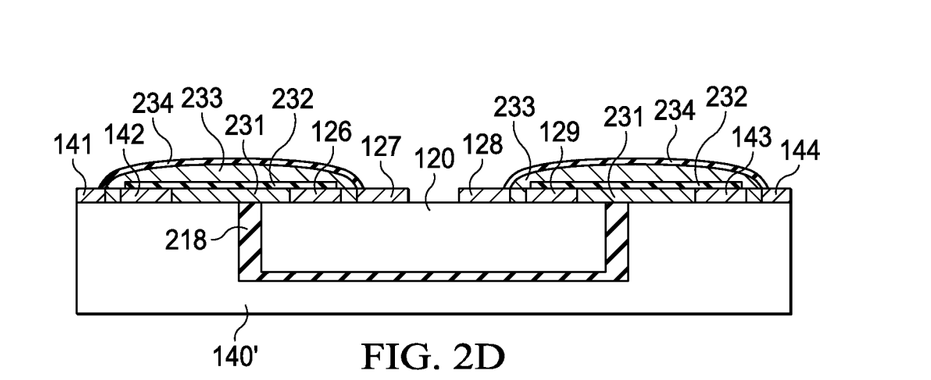

FIG. 2D shows the resulting structure after another dielectric layer 233 is printed over the interconnect 232 and is then sintered or cured, and another electrically conductive (e.g., metal) interconnect layer (interconnect) layer 234 is printed over the dielectric layer 233 and is then sintered or cured. Although described herein as having separate sinters or cures, a plurality of ink-based layers can be sintered in a given sintering or curing step. Although not shown, the interconnects 231, 232 together with dielectric layer 233 can be used to form a variety of different multi-conductive layer interconnects to connect any desired bond pad on the die 120 to any substrate pad on the substrate 140'.

Figure 3A:
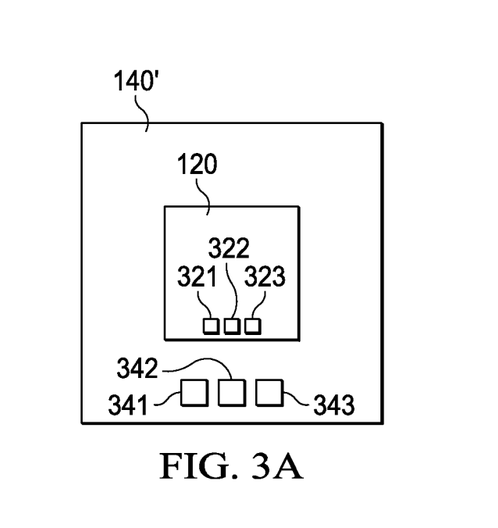
FIGS. 3A and 3B depicts a die on a substrate before and after the printing of an arbitrary interconnect shape in the x-y plane on an additively printed dielectric layer, respectively, according to an example embodiment.
Figure 3B:
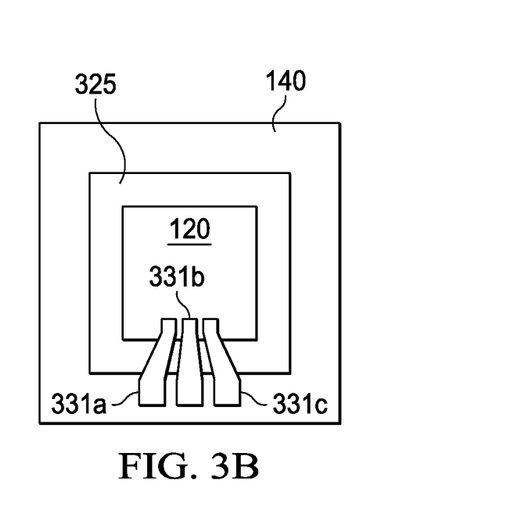

FIGS. 3A and 3B depict a top-down view of a die 120 on a substrate 140 before and after the printing of electrically conductive interconnects 331a, 331b, 331c each of the same arbitrary shape in the x-y plane on a printed dielectric layer 325, respectively, according to an example embodiment. In FIG. 3A, the bond pads are shown as 321, 322 and 323 and substrate pads are shown as 341, 342 and 343. In FIG. 3B the interconnects 331a, 331b, 331c are shown connecting respective bond pads to respective substrate pads. A variety of other arbitrary shapes can be utilized.

Figure 4A:
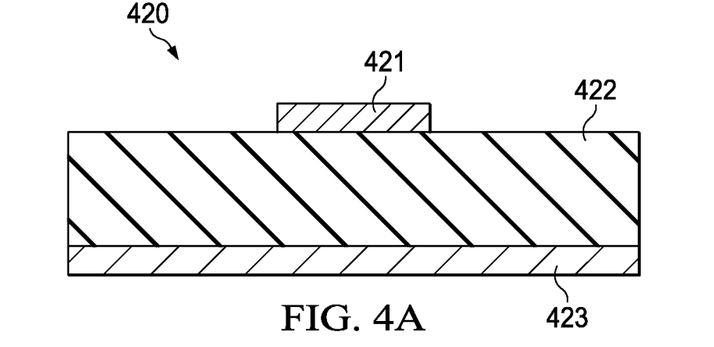
FIGS. 4A-C depict example cross sections of portions of additively printed interconnects that are electrical structures which are more complex compared to a conventional uniform bond wire, according to an example embodiment.
Figure 4B:
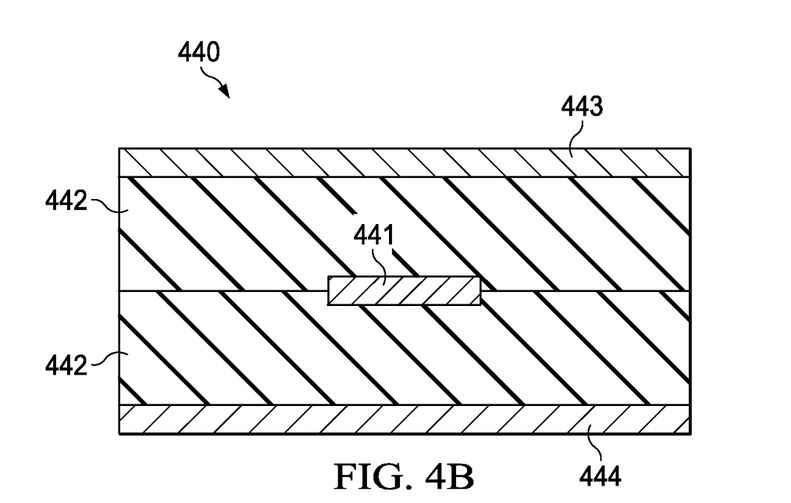
Figure 4C:
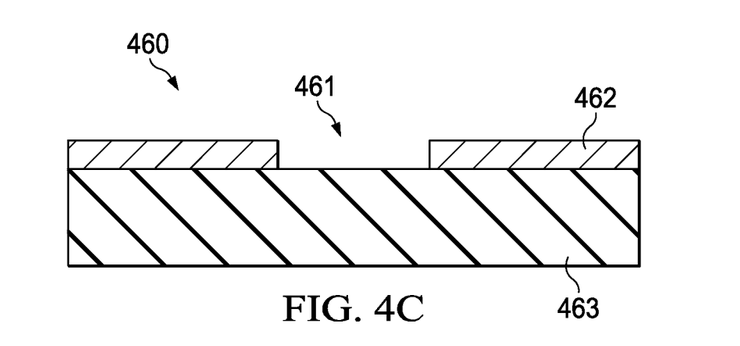

FIGS. 4A-C depict example cross sections of printed interconnects which are electrical structures that are more complex than a single conventional uniform wire, according to an example embodiment. The cross section of the printed interconnects can be a single metallic wire resembling a conventional wirebond wire, or can be a more complex electrical structure such as the example portions of waveguide transmission lines shown in FIGS. 4A-C, or other multi-conductor waveguide such as twin line (twisted pair) or coplanar waveguide (CPW).

FIG. 4A shows a cross section view of a portion of an additively printed microstrip transmission line 420 that is one example of a multi-conductor transmission line. The microstrip transmission line 420 comprises an electrically conducting strip 421 separated from a ground plane 423 by a dielectric layer 422 generally referred to as a substrate. FIG. 4B shows a cross section view of a portion of an additively printed stripline transmission line (stripline) 440 that is another example of a multi-conductor transmission line. A stripline is a conductor 441 sandwiched by a dielectric layer 442 between a pair of groundplanes 443 and 444. FIG. 4C shows a cross section view of a portion of an additively printed slotline (or slotted line) transmission line 460. A slot 461 in a metal layer 462 comprises a cut with a width that is over a dielectric layer or substrate 463.

Another disclosed embodiment comprises ink-based printed EMI shielding formed using an inkjet, aerosol jet, screen printing or similar apparatus to deposit patterned electrically conductive or magnetic shielding structures over selective areas of the die. FIGS. 5A-D depict steps in an example ink-based method that includes ink deposition of on-chip EMI shielding, according to an example embodiment. The EMI sensitive regions of a die can be identified from a circuit simulation. The EMI sensitive regions can be first surrounded by a metal guard ring at the die level that is connected on the die to the die's ground bond pad(s). This grounded guard ring is what the printed EMI shield will be connected to for providing a grounded EMI shield. A dielectric material is then printed over the die which functions as a mechanical support layer for the later additively deposited EMI shield. Typically, this mechanical support will be a 1 µm to 100 µm thick layer, which can comprise a polymer such as a polyimide, an epoxy-based negative photoresist known as SU-8, Benzocyclobutene (BCB), Poly (p-phenylene-2,6-benzobisoxazole) (PBO), etc.), or a dielectric material such as SiN, $SiO_2$, siloxane, or other oxides, or a ceramic.

Following the printing of the mechanical support layer, the electrically conductive (e.g., metal) or magnetic shield is printed over the mechanical support layer. The conductive shield can be based on a metallic nanoparticle ink or an electrically conducting (e.g., conjugated) polymer or electrically conducting oxide. The magnetic shield can be based on a magnetic nanoparticle ink. The edges of the EMI shield connect to the patterned guard ring on the die to provide a grounded interface for the EMI shield. The electrically conductive or magnetic EMI shield can either be a solid (unpatterned) cap, or it can be patterned into a grid, a frequency selective surface (e.g., frequency selective surfaces (FSS)/or Electromagnetic Band Gap (EBG structure), or another pattern.

Figure 5A:
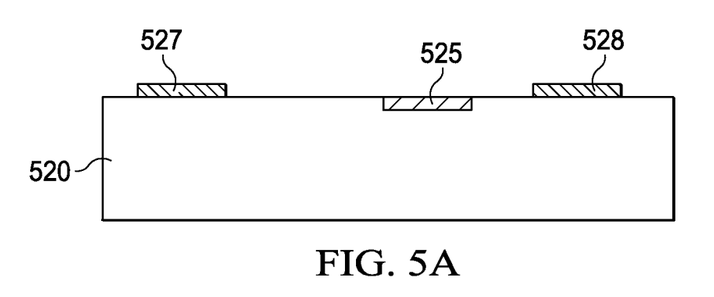
FIGS. 5A-D depict steps in an example method that includes ink deposition to form on-die EMI shielding, according to an example embodiment.
Figure 5B:
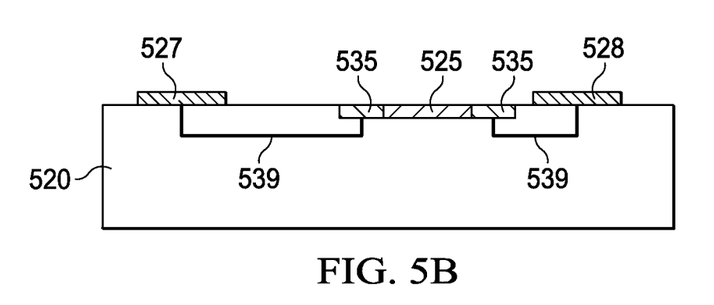

FIG. 5A is a cross sectional depiction of a die 520 showing an EMI sensitive region 525, and a first ground bond pad 527 and a second ground bond pad 528. FIG. 5B is a cross sectional depiction of a die showing the EMI sensitive region 525 surrounded by an electrically conducting (e.g., metal or highly doped semiconductor guard ring 535 at the die level that has connectors 539 (either within the semiconductor surface as shown in FIG. 5B or on the semiconductor surface) for connecting the guard ring 535 to the first ground bond pad 527 and a second ground bond pad 528. The guard ring 535 being grounded is what the printed EMI shield will be connected to for providing a grounded EMI shield.

Figure 5C:
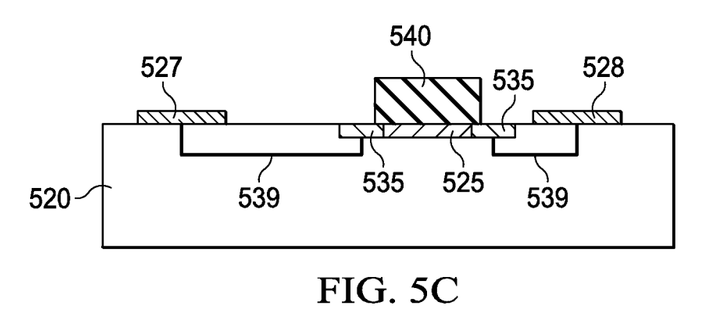
Figure 5D:
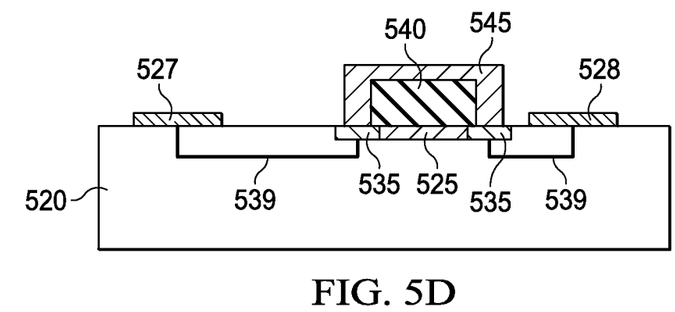

FIG. 5C is a cross sectional depiction of the die 520 showing a dielectric layer 540 over the EMI sensitive region 525 which will function as a mechanical support layer for the later additively deposited EMI shield. Dielectric layer 540 can comprise an ink residue or conventionally formed layer. Typically, dielectric layer 540 to function as a mechanical support will be a 1 μm to 100 μm thick layer that can comprise a polymer such as polyimide, SU-8, BCB, PBO, etc. . . . ) or a dielectric material such as SiN, silicon oxide, siloxane or other oxide, or a ceramic. FIG. 5D is a cross sectional depiction of the die 520 showing following the forming of the dielectric layer 540 the forming of an electrically conductive or magnetic EMI shield layer (EMI shield) 545 comprising an ink residue over the dielectric layer 540. EMI shield is coupled to the guard ring 535 to allow its grounding, as the connectors 539 connect the guard ring 535 to the ground bond pad 527, 528. The EMI shield 545 can be formed from a metallic nanoparticle ink or an electrically conducting polymer or oxide. The magnetic shield can be based on a magnetic nanoparticle ink.

Figure 6A:
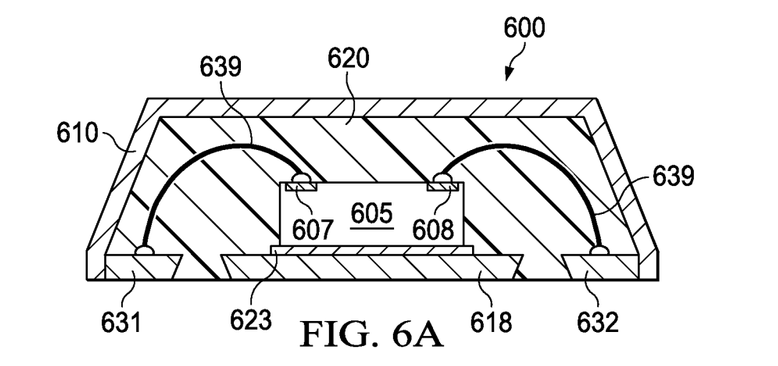
FIG. 6A depicts a package semiconductor device having a printed EMI shield conformally formed on the mold of the package, wherein the EMI shield is coupled to a ground pin on a lead or ball of the package, according to an example embodiment.

A disclosed EMI shield 545 can also be printed conformally on the outside of a package where an electrically conductive (e.g., metallic or conducting polymer) or magnetic film is patterned over the package and interfaced with a ground pin on a lead or ball of the package. FIG. 6A is a cross sectional depiction of a leadless semiconductor package 600 including a die 605 having ground bond pads 607 and 608 on die attach material 623 on a die pad 618 having an electrically or magnetically conductive EMI shield (EMI shield) 610 comprising an ink residue following conformal printing over the outside of the mold compound 620 of the package 600 then sintering or curing. The leadless semiconductor package 600 has pins 631 and 632 which are coupled by bond wires 639 to the ground bond pads 607 and 608. The EMI shield 610 is over the mold compound 620 and connects to pins 631 and 632 for a ground connection. Example patterns for EMI shield 610 include unpatterned (solid), mesh, and a sheet with periodic 'holes' arranged in a periodic pattern.

Figure 6B:
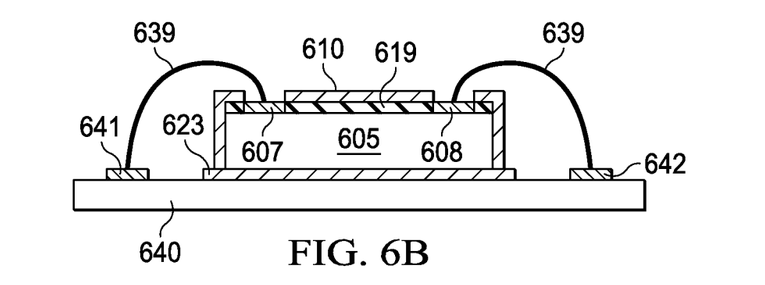
FIG. 6B depicts a die on a substrate, where a printed EMI shield is conformally over the passivation of the die and contacting at least bond pad connected to ground on the die, according to an example embodiment.

FIG. 6B is a cross sectional depiction of a die 605 on a package substrate 640 having substrate pads 641, 642 including an example EMI shield 610 comprising an ink residue following conformal printing over the die 605. EMI shield 610 contacts the ground bond pads 607 and 608 and a passivation layer 619 lateral to the ground bond pads 607 and 608. EMI shield 610 is a patterned shield having the respective holes shown to avoid shorting to the substrate pads 641, 642 through bond wires 639.

Disclosed embodiments can be integrated into a variety of assembly flows to form a variety of different packaged semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A packaged semiconductor device, comprising:
   a first semiconductor die having a plurality of bond pads thereon mounted face up on a substrate having a plurality of substrate pads;
   a first dielectric layer comprising a first ink residue extending from said plurality of substrate pads to said plurality of bond pads; and
   a first electrically conductive interconnect comprising a second ink residue on said first dielectric layer extending from said respective ones of said plurality of substrate pads to respective ones of said plurality of bond pads to connect said respective ones of said plurality of substrate pads to said respective ones of said plurality of bond pads.

2. The packaged semiconductor device of claim 1, further comprising:
   a second dielectric layer comprising a third ink residue on said first electrically conductive interconnect; and
   printing a second electrically conductive interconnect comprising an fourth ink residue over said second dielectric layer to provide a multi-level conductor interconnect which connects said respective ones of said ones of said plurality of substrate pads to said respective ones of said plurality of bond pads.

3. The packaged semiconductor device of claim 2, wherein said multi-level conductor interconnect comprises a microstrip waveguide.

4. The packaged semiconductor device of claim 2, wherein said multi-level conductor interconnect comprises a stripline waveguide.

5. The packaged semiconductor device of claim 2, wherein said multi-level conductor interconnect comprises a slotline waveguide.

6. The packaged semiconductor device of claim 1, wherein said second ink residue comprises a plurality of metal particles.

7. The packaged semiconductor device of claim 1, wherein said substrate comprises a package substrate and said package substrate includes an inset region, and wherein said first semiconductor die is within said inset region.

8. The packaged semiconductor device of claim 1, wherein said first ink residue has a porosity of at least 20% in at least a portion thereof.

9. The packaged semiconductor device of claim 1, wherein said second ink residue comprises an electrically conductive polymer.

10. The packaged semiconductor device of claim 1, wherein said substrate comprises a package substrate.

11. The packaged semiconductor device of claim 10, wherein said package substrate comprises a printed circuit board (PCB).

12. The packaged semiconductor device of claim 10, wherein said package substrate comprises an organic substrate.

13. The packaged semiconductor device of claim 10, wherein said package substrate comprises a flexible plastic substrate.

14. The packaged semiconductor device of claim 10, wherein said package substrate comprises a paper-based substrate.

15. The packaged semiconductor device of claim 1, wherein said substrate comprises a lead frame having a die pad.

16. The packaged semiconductor device of claim 1, wherein said substrate pads comprises terminals pads.

17. The packaged semiconductor device of claim 1, wherein said substrate pads comprises contact pads.

18. The packaged semiconductor device of claim 1, wherein said second ink residue comprises a doped semiconductor.

* * * * *